United States Patent
Takiar et al.

(10) Patent No.: US 7,336,498 B2
(45) Date of Patent: Feb. 26, 2008

(54) MEMORY CARD WITH PUSH-PUSH CONNECTOR

(75) Inventors: Hem P. Takiar, Fremont, CA (US); Robert Miller, San Jose, CA (US)

(73) Assignee: SanDisk Corporation, Milpitas, CA (US)

(*) Notice: Subject to any disclaimer, the term of this patent is extended or adjusted under 35 U.S.C. 154(b) by 320 days.

(21) Appl. No.: 10/952,591

(22) Filed: Sep. 28, 2004

(65) Prior Publication Data

US 2005/0111280 A1 May 26, 2005

Related U.S. Application Data

(63) Continuation of application No. 10/851,466, filed on May 20, 2004, which is a continuation-in-part of application No. 29/194,064, filed on Nov. 19, 2003, now Pat. No. Des. 523,435, which is a continuation-in-part of application No. 10/621,882, filed on Jul. 17, 2003, which is a continuation-in-part of application No. 29/186,546, filed on Jul. 17, 2003, now Pat. No. Des. 525,248.

(51) Int. Cl.
*H05K 1/14* (2006.01)
(52) U.S. Cl. ............... 361/737; 361/736; 361/782
(58) Field of Classification Search ........ 361/736–737, 361/756–759
See application file for complete search history.

(56) References Cited

U.S. PATENT DOCUMENTS

| | | |
|---|---|---|
| 5,296,692 A | 3/1994 | Shino |
| 5,408,386 A | 4/1995 | Ringer |
| 5,490,891 A | 2/1996 | Farquhar |
| 5,502,289 A | 3/1996 | Takiar |
| 5,537,292 A | 7/1996 | Bowen |
| 5,603,629 A | 2/1997 | DeFrasne |
| 5,608,606 A | 3/1997 | Blaney |
| 5,617,297 A | 4/1997 | Lo |

(Continued)

FOREIGN PATENT DOCUMENTS

EP  0377937  7/1990

(Continued)

OTHER PUBLICATIONS

Office Action dated Sep. 7, 2005, U.S. Appl. No. 10/851,466.

(Continued)

*Primary Examiner*—Tuan T. Dinh
(74) *Attorney, Agent, or Firm*—Vierra Magen Marcus & DeNiro LLP

(57) ABSTRACT

The present invention, roughly described, pertains to a small memory card that includes features which allow the memory card to be more easily handled by a user. In various embodiments, the memory card can include a chamfer and/or a raised portion that allows the memory card to be more easily grabbed by a human hand (or mechanical device) and also provides additional room to store passive devices such as capacitors and/or resistors. Because different electronic devices use different types of memory cards, an adaptor is provided that allows the memory cards disclosed herein to be used in ports or connectors on electronic devices that are meant for other types of memory cards.

17 Claims, 15 Drawing Sheets

U.S. PATENT DOCUMENTS

| | | | |
|---|---|---|---|
| 5,663,901 A | 9/1997 | Wallace | |
| 5,736,727 A | 4/1998 | Nakata et al. | |
| 5,752,857 A | 5/1998 | Knights | |
| 5,867,218 A | 2/1999 | Matsuzaki | |
| 5,933,328 A | 8/1999 | Wallace | |
| 5,986,891 A | 11/1999 | Sugimoto | |
| 6,040,622 A | 3/2000 | Wallace | |
| 6,085,412 A | 7/2000 | Iwasaki | |
| 6,109,939 A | 8/2000 | Kondo et al. | |
| 6,151,248 A | 11/2000 | Harari | |
| D439,579 S | 3/2001 | Auclair | |
| D442,598 S | 5/2001 | Wallace | |
| D444,473 S | 7/2001 | Okamoto | |
| D445,096 S | 7/2001 | Wallace | |
| D445,111 S | 7/2001 | Okamoto | |
| 6,266,724 B1 | 7/2001 | Harari et al. | |
| D446,525 S | 8/2001 | Okamoto | |
| 6,279,114 B1 | 8/2001 | Toombs et al. | |
| D447,481 S | 9/2001 | Wallace | |
| 6,323,064 B1 | 11/2001 | Lee | |
| D452,243 S | 12/2001 | Wallace | |
| D452,244 S | 12/2001 | Wallace | |
| D452,245 S | 12/2001 | Wallace | |
| D452,246 S | 12/2001 | Wallace | |
| 6,333,517 B1 | 12/2001 | Tamaki | |
| D452,690 S | 1/2002 | Wallace | |
| D452,864 S | 1/2002 | Wallace | |
| D452,865 S | 1/2002 | Wallace | |
| D453,515 S | 2/2002 | Brewer | |
| D453,934 S | 2/2002 | Wallace | |
| 6,357,663 B1 | 3/2002 | Takahashi | |
| D457,887 S | 5/2002 | Kadonaga | |
| D459,355 S | 6/2002 | Shomoda | |
| 6,410,355 B1 | 6/2002 | Wallace | |
| D460,456 S | 7/2002 | Shomoda | |
| 6,456,528 B1 | 9/2002 | Chen | |
| 6,462,273 B1 | 10/2002 | Corisis et al. | |
| 6,478,679 B1 | 11/2002 | Himoto | |
| D467,586 S | 12/2002 | Shomoda | |
| 6,537,842 B2 | 3/2003 | Akram | |
| 6,611,284 B2 | 8/2003 | Lourie | |
| 6,616,053 B2 | 9/2003 | Kondo | |
| 6,618,258 B2 | 9/2003 | Goris | |
| 6,631,201 B1 | 10/2003 | Dickinson | |
| 6,658,510 B1 | 12/2003 | Bartucca | |
| 6,658,516 B2 | 12/2003 | Yao | |
| 6,663,398 B2 | 12/2003 | Shimada | |
| 6,669,494 B2 | 12/2003 | Abe | |
| D487,747 S | 3/2004 | Yu | |
| D488,476 S | 4/2004 | Yu | |
| D488,477 S | 4/2004 | Yu | |
| 6,726,508 B2 * | 4/2004 | Watanabe et al. | 439/677 |
| 6,729,548 B2 | 5/2004 | Kondo | |
| 6,736,678 B2 | 5/2004 | Yao | |
| 6,738,259 B2 | 5/2004 | Le | |
| D492,688 S | 7/2004 | Wallace | |
| 6,832,920 B2 | 12/2004 | Glad | |
| 6,920,517 B2 | 7/2005 | Mills | |
| 7,094,633 B2 | 8/2006 | Takiar | |
| 2001/0015382 A1 | 8/2001 | Tiffany | |
| 2002/0042125 A1 | 4/2002 | Peterson | |
| 2003/0181074 A1 | 9/2003 | Liu | |
| 2004/0041024 A1 | 3/2004 | Liu | |
| 2004/0043664 A1 | 3/2004 | Sato | |
| 2004/0064619 A1 | 4/2004 | Liu | |
| 2004/0089717 A1 | 5/2004 | Harari et al. | |
| 2005/0011671 A1 | 1/2005 | Takiar | |
| 2005/0021909 A1 | 1/2005 | Much | |
| 2005/0105360 A1 | 5/2005 | Takiar | |
| 2005/0111280 A1 | 5/2005 | Takiar | |
| 2005/0148217 A1 | 7/2005 | Takiar | |

FOREIGN PATENT DOCUMENTS

| | | |
|---|---|---|
| EP | 0581284 | 2/1994 |
| EP | 0717589 | 6/1996 |
| EP | 0720123 | 7/1996 |
| EP | 0964360 | 12/1999 |
| EP | 0971312 | 1/2000 |
| EP | 01193807 | 12/2005 |
| JP | D1092477 | 12/2000 |
| JP | D1111788 | 6/2001 |
| JP | D1140249 | 4/2002 |
| JP | D1210509 | 6/2004 |
| JP | D1211215 | 7/2004 |
| JP | D1211372 | 7/2004 |
| JP | D1212851 | 7/2004 |
| WO | WO 01 88843 | 11/2001 |
| WO | 02059831 A1 | 8/2002 |
| WO | 03055009 | 7/2003 |

OTHER PUBLICATIONS

Office Action dated Jun. 6, 2006, U.S. Appl. No. 10/851,466.
Office Action dated Oct. 18, 2006, U.S. Appl. No. 10/995,989.
Office Action dated Jun. 15, 2005, U.S. Appl. No. 10/952,609.
Office Action dated Aug. 24, 2005, U.S. Appl. No. 10/952,609.
Office Action dated Apr. 7, 2006, U.S. Appl. No. 10/952,609.
"SanDisk Introduces the World's Smallest Removable Flash Card for Mobile Phones-The miniSD Card," www.sandisk.com/pressrelease/031303_minisd.htm, Nov. 18, 2004.
Photograph of MiniSD, Japanese reference, Mar. 25, 2003.
Photograph of MiniSD Card, Mar. 25, 2003.
Photograph of MultiMedia Card, May 2000.
Photograph of SmartMedia Card, May 2000.
Photograph of SD Card, May 2001.
Quick Start Guide for the Oinoco 802.11a/b ComboCard, 2002 Proxim Corporation, pp. 1-12.
Netgear 802.11a/b Dual Band Wireless PC Card, 5 GHz/2.4GHz WAB501 User's Guide, Feb. 2003 Netgear, Inc. pp. 1-29.
SD Card Specification, Simplified Version of Secure Digital Input/Output (SDIO) Card Specification, Version 1.00, Oct. 2001, SD Association, pp. 1-20, Appendix A-E.
The MultiMedia Card System Summary, Version 3.2, MMCA Technical Committee, Jan. 2002.
High Capacity and Small Size, Meeting the Storage Needs of Today's Portable Devices, 2003 SanDisk Corporation.
Notice of Allowance dated Jul. 25, 2007, U.S. Appl. No. 10/782,969, filed Feb. 20, 2004.
Notice of Allowance dated Jul. 27, 2007, U.S. Appl. No. 10/851,466, filed May 20, 2004.

* cited by examiner

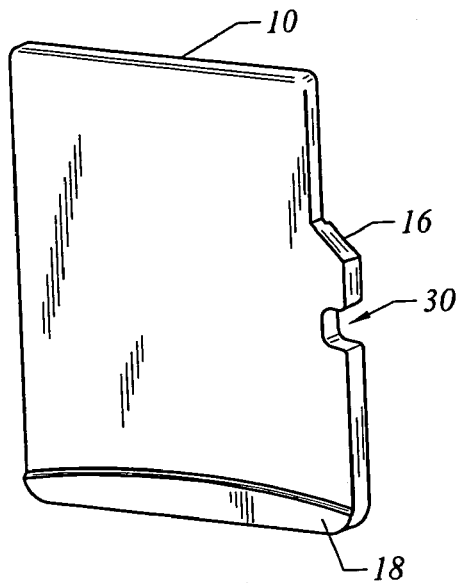
FIG. 7A
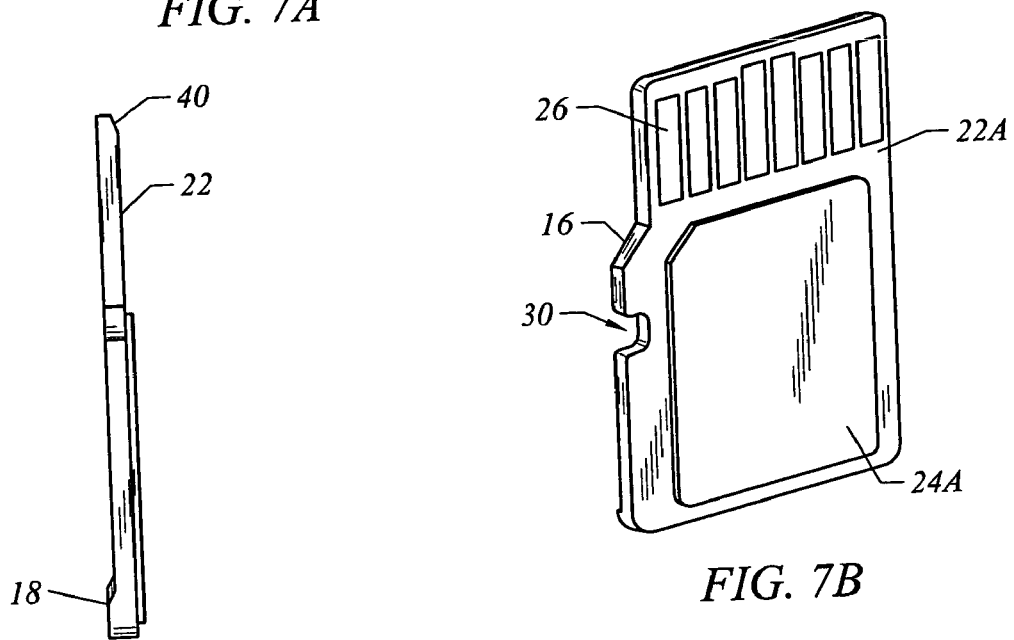
FIG. 7B
FIG. 7C
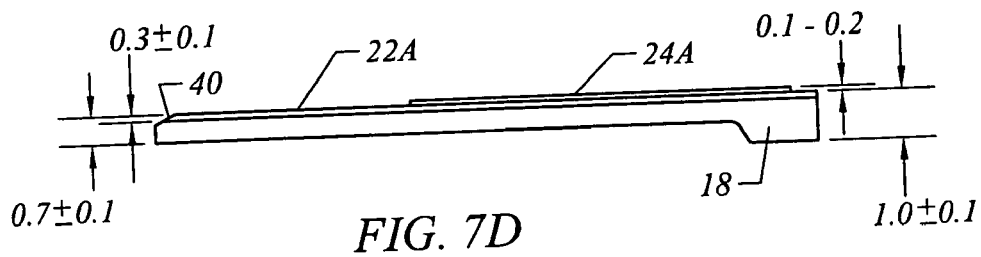
FIG. 7D

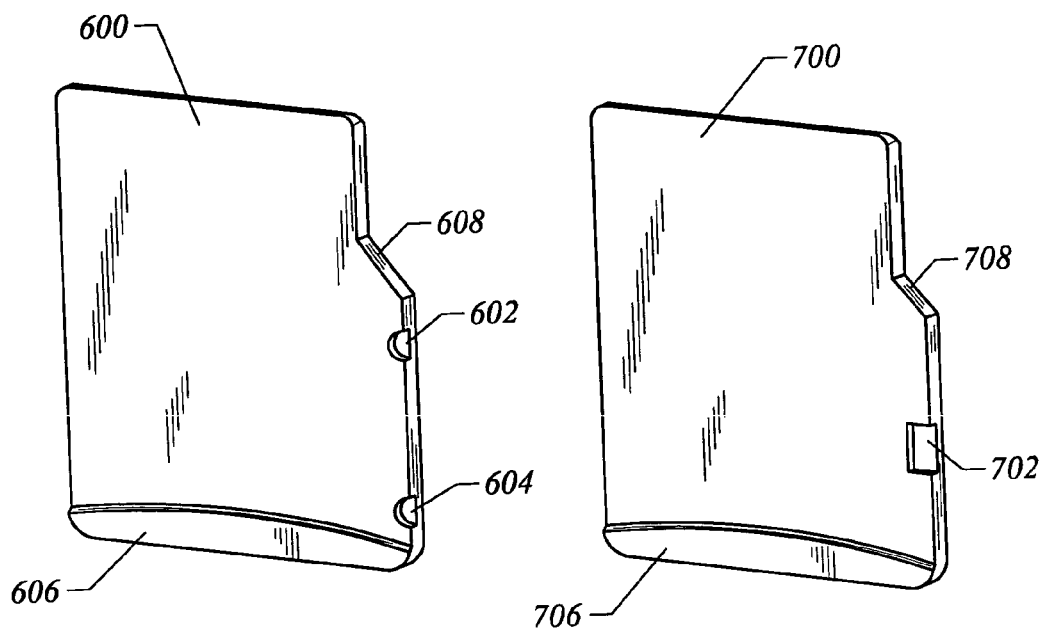
FIG. 19
FIG. 21
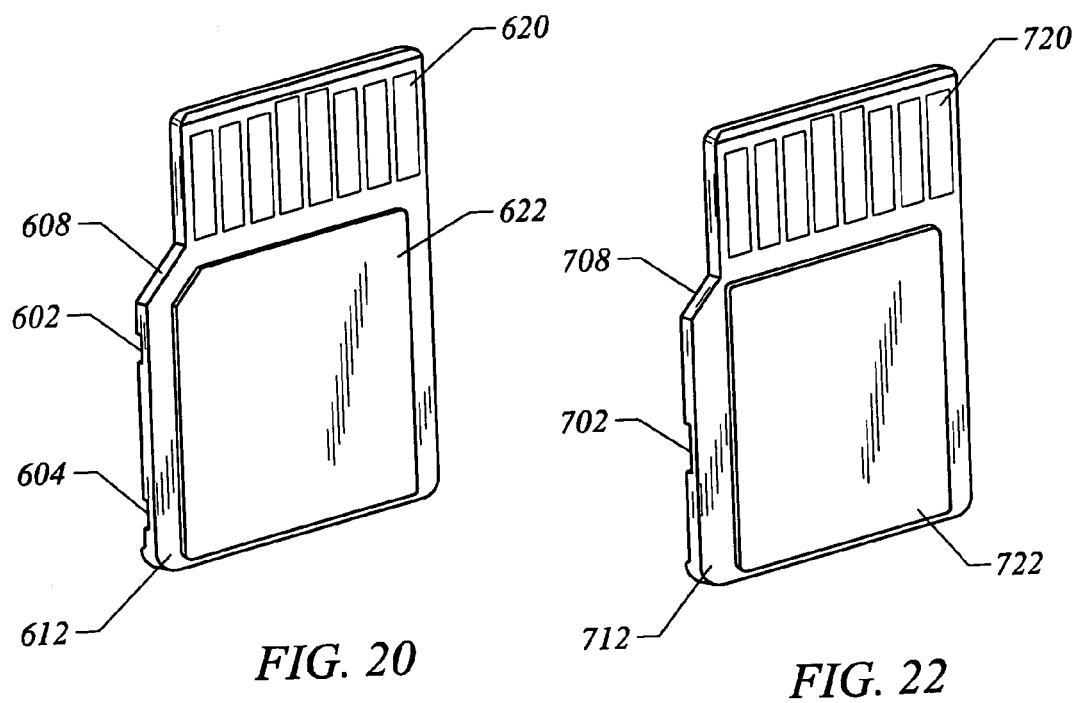
FIG. 20
FIG. 22 released locked

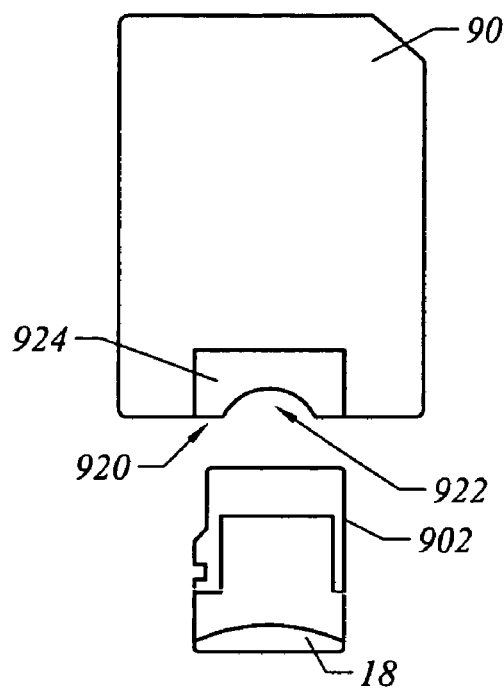 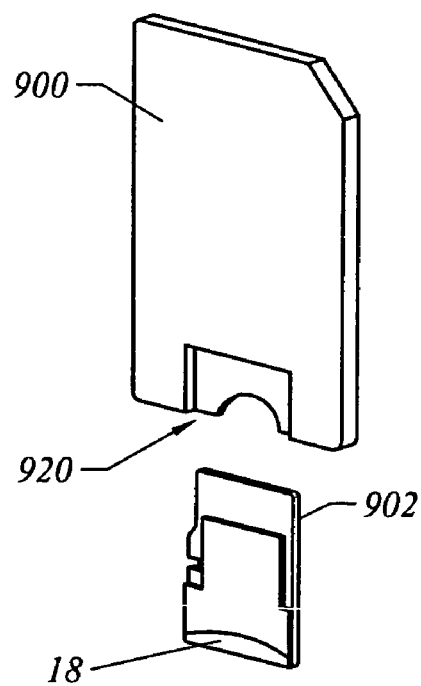
FIG. 28A    FIG. 28B
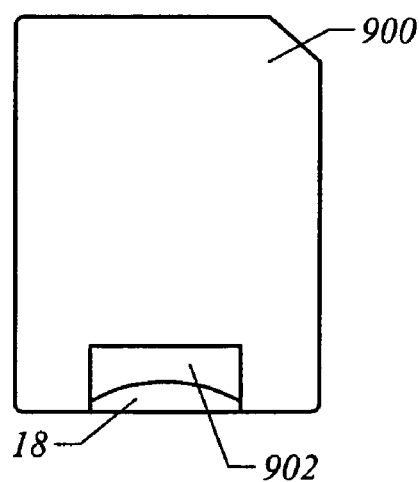 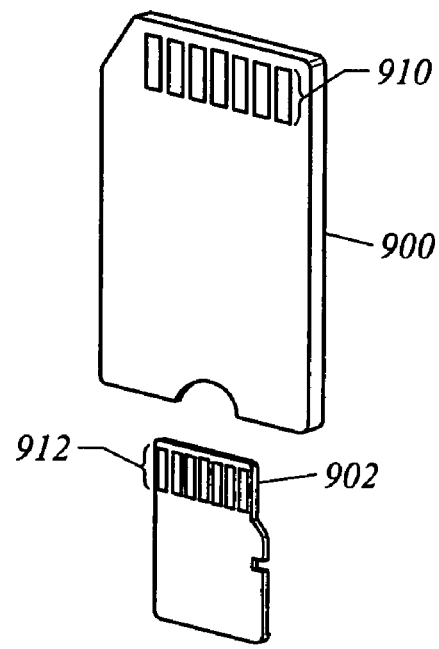
FIG. 28D
FIG. 28C

MEMORY CARD WITH PUSH-PUSH CONNECTOR

This application is a continuation application of U.S. patent application Ser. No. 10/851,466, entitled "Memory Card With and Without Enclosure," filed May 20, 2004, which is a continuation-in-part application of the following three applications: (1) U.S. patent application Ser. No. 10/621,882, entitled "Peripheral Card with Hidden Test Pins," filed Jul. 17, 2003 by Hem P. Takiar; (2) U.S. Design Application 29/186,546 entitled "Memory Card," filed Jul. 17, 2003, now U.S. Pat. No. D,525,248 by Hem P. Takiar; and (3) U.S. Design Application 29/194,064 entitled "Memory Card," filed Nov. 19, 2003, now U.S. Pat. No. D,523,435 by Takiar et al. All four of these applications are incorporated herein by reference.

CROSS-REFERENCE TO RELATED APPLICATIONS

This Application is also related to the following additional United States Patent Applications, both of which are incorporated herein by reference in their entirety:

"Method For Efficiently Producing Removable Peripheral Cards," application Ser. No. 10/602,373, filed Jun. 23, 2003, Hem P. Takiar; and "Memory Card With Raised Portion," application Ser. No. 10/782,969, filed Feb. 20, 2004, Hem P. Takiar.

BACKGROUND OF THE INVENTION

1. Field of the Invention

The present invention is directed to technology for peripheral cards.

2. Description of the Related Art

Memory cards are relatively small removable cards that provide data storage. In most cases, but not required in all cases, the memory card is integrated circuit based. These memory cards plug into or are received by ports or connectors on electronic devices, including computing devices, cameras, mobile telephones, PDAs and other devices. One example of a memory card uses non-volatile memory. Electrical Erasable Programmable Read Only Memory (EEPROM) and flash memory are among the most popular non-volatile semiconductor memories. Some examples of memory cards includes CompactFlash™, MMC™, Smart Media, Secure Digital™, MiniSD and the Memory Stick.

A flash memory card is a memory card that has one or more arrays of flash memory cells. Some flash memory cards also include bit line decoders, word line decoders, a state machine, a controller and other circuitry. In many cases the controller will be implemented in a first semiconductor die, while the array of flash memory cells, bit line decoders, word line decoders, and state machine are implemented in a second semiconductor die. Over time, flash memory arrays have increased density by shrinking the size of an individual memory cell and by implementing greater numbers of memory cells in the array.

To maintain product reliability and customer satisfaction, manufacturers of memory cards will test the memory cards during the manufacturing process in order to determine if there are any manufacturing defects. In many cases, the user I/O pins on the memory card connect to the controller. However, a test performed during manufacturing typically seeks to directly access the memory array (bypassing the controller) in order to test each cell in the memory array. Additionally, more pins will allow for more efficient and complete testing of the relevant components of the memory card. Thus, many memory cards will include test pins, in addition to the user I/O pins. To protect the memory card from electrostatic discharge relative to the test pins and to protect the data on the card from being wrongfully accessed via the test pins, the test pins should not be exposed to the user of the memory card after the manufacturing process.

One example of a memory card is described in U.S. Pat. No. 6,410,355 (the '355 patent"), incorporated herein by reference in its entirety. In the '355 patent, a memory card using flash memory is manufactured with a set of test pins at one edge of the memory card. After the memory card is tested, the test pins are cut off of the memory card and the memory card is then packaged. While the device of the '355 patent has worked well, there is a need for an improvement. First, the test pins that are cut off use real estate on the circuit board. There is a trend to increase density on circuit boards; therefore, it would be advantageous to not use a portion of the circuit board for components that will not ship to customers. Second, if the memory card fails in the field, there are no test pins to test the device in order to determine why the memory card failed. Such tests following device failure allow a manufacturer of memory cards to improve device reliability and the manufacturing process.

Another example of a memory card using flash memory is the recently released Mini-SD Card. In one commercial version of the Mini-SD Card, the memory array is mounted on the top of the circuit board and the controller is mounted on the memory array. User I/O pins and test pins are formed on the bottom of the circuit board. After the memory card is tested, the circuit board (with the controller, memory array and other components) are enclosed by attaching a top lid to a bottom lid. Both the bottom lid and the top lid are made of a hard plastic, and are manufactured from a mold prior to enclosing the circuit board. After the top and bottom lids are made, the top lid is ultra-sonically welded to the bottom lid to enclose the circuit board (with the controller, memory array and other components). The bottom lid has an opening for the user I/O pins. The bottom lid does not have an opening for the test pins; therefore, the test pins are not exposed to users. There will be a small air gap between the bottom lid and the bottom of the circuit board. While this design works well, the top and bottom lids are relatively expensive to manufacture. Additionally, the lids are relatively bulky which limits how small the memory cards can be manufactured. The trend in the industry to further decrease the size of memory cards.

As the memory cards are made smaller, they become increasingly difficult to handle by a human. Additionally, as the memory cards are made smaller, small variations in the packaging will have a larger proportional effect on the card. For example, due to the size of the memory card in relation to a human hand and due to variations in manufacturing, very small memory cards may be difficult to insert and/or remove into ports or connectors on electronic devices.

SUMMARY OF THE INVENTION

The present invention, roughly described, pertains to a small memory card that includes features which allow the memory card to be more easily handled by a user.

One embodiment of the present invention includes a memory card with a chamfer. In some examples, the memory card is rectangular, and a diamond saw is used to cut a flat surface from the edge of the rectangular memory card. In one implementation, the memory card is made by adding devices to a circuit board, performing an encapsulation process or molding process (e.g., injection mold or transfer mold) to cover the devices and then cutting a flat surface from the edge of the rectangular memory card.

In another embodiment, the memory card includes a raised portion that allows the memory card to be more easily grabbed by a human hand (or mechanical device) and also provides additional room to store passive devices such as capacitors and/or resistors.

There are various ports or connectors on electronic devices that can receive the memory cards described herein. One example is a push-push connector. The memory card is inserted into the connector using a first push against the memory card. Pushing the memory card a second time releases the memory card from the connector. In one embodiment, when the memory card is pushed the second time, it is released from the connector such that the raised portion of the memory card is protruding from the connector or host device. In this manner, the user can grab the memory card by the raised portion to fully remove it from the connector. In another embodiment, the raised portion will protrude from the connector after the first push and prior to the second push (i.e., while the memory card is connected) to make it easier from the user to handle the memory card.

Because different electronic devices use different types of memory cards, an adaptor is provided that allows the memory cards disclosed herein to be used in ports or connectors on electronic devices that are meant for other types of memory cards (e.g. CompactFlash™, MMC™, Smart Media, Secure Digital™, MiniSD and the Memory Stick.). In some implementations, the raised portion of the memory card protrudes from the adaptor or can otherwise be accessed by a user when the card is properly inserted in the adaptor.

While in the adaptor, the memory card can be inserted into a host device and data can be written to and read form the memory card. Similarly, the memory card can be inserted into a host device and data can be written to and read form the memory card when the memory card is not in the adaptor. As described herein, the memory card can be manufactured and used without a bottom lid or a top lid. Such a memory card can then be inserted into an adaptor, where the adaptor includes or serves as a top lid and/or bottom lid. As described above, the memory card can be used while in the adaptor that includes or serves as a top lid and/or bottom lid.

The present invention can be applied to the manufacture of memory cards, including flash memory cards. The technology disclosed herein can also be applied to other memory cards or other peripheral cards. For example, the present invention can be used with removable peripheral cards that include wireless communication devices, GPS devices, cellular devices, network interfaces, modems, disk storage systems, and other devices. The present invention is not limited to any one type of peripheral card.

These and other objects and advantages of the present invention will appear more clearly from the following description in which the preferred embodiment of the invention has been set forth in conjunction with the drawings.

BRIEF DESCRIPTION OF THE DRAWINGS

FIG. 7A is a perspective view of the top of a memory card according to a one embodiment of the present invention.

FIG. 7B is a perspective view of the bottom of the memory card according to the one embodiment of the present invention.

FIG. 7C is a side view of the memory card according to the one embodiment of the present invention.

FIG. 7D is a side view of the memory card according to the one embodiment of the present invention.

FIG. 19 is a perspective view of the top of the memory card according to an additional embodiment of the present invention.

FIG. 20 is a perspective view of the bottom of the memory card according to the embodiment of FIG. 19.

FIG. 21 is a perspective view of the top of the memory card according to an additional embodiment of the present invention.

FIG. 22 is a perspective view of the bottom of the memory card according to the embodiment of FIG. 21.

FIGS. 28A-D show a memory card and an adapter 900.

DETAILED DESCRIPTION

Figure 1:
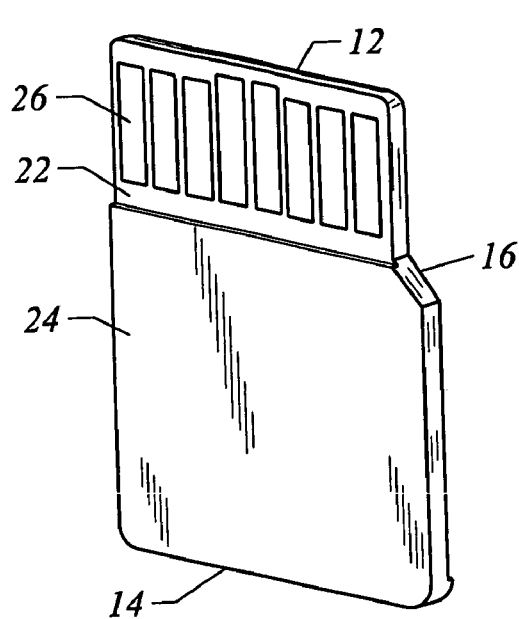
FIG. 1 is a perspective view of the bottom of a memory card according to a one embodiment of the present invention.
Figure 2:
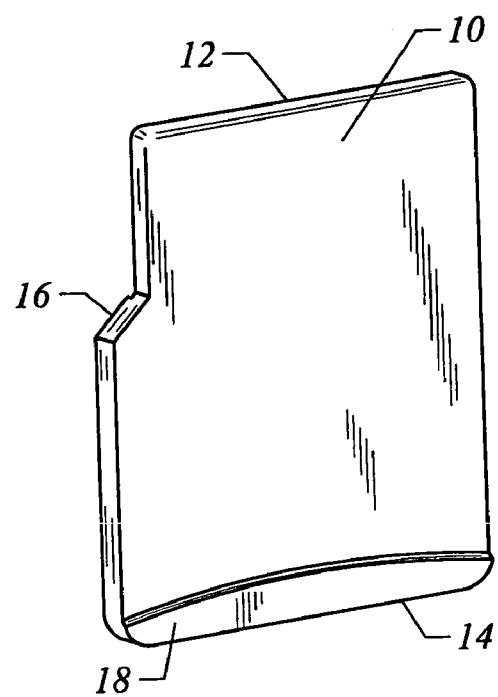
FIG. 2 is a perspective view of the top of the memory card according to the one embodiment of the present invention.
Figure 3:
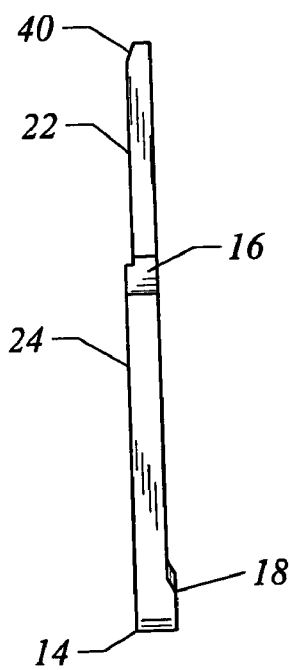
FIG. 3 is a side view of the memory card according to the one embodiment of the present invention.

FIGS. 1-10 depict various embodiments of a memory card. For example, FIG. 1 is a perspective view of the bottom of a memory card according to a first embodiment of the present invention. FIG. 2 is a perspective view of the top of the memory card according to the first embodiment of the present invention. FIG. 3 is a side view of the memory card according to the first embodiment of the present invention. The memory card of FIGS. 1-3 includes a top surface 10, a bottom surface, a front surface 12, a back surface 14 and two side surfaces. One of the side surfaces has an angle portion 16. Top surface 10 has a raised portion 18 adjacent to back surface 14. Raised portion 18 allows the memory card to be more easily grabbed by a human hand (or mechanical device) and also provides additional room to store passive devices such as capacitors and/or resistors. Note that raised portion 18 of FIG. 1 has a curved profile. The bottom surface includes a first portion 22 and a second portion 24. Second portion 24 is raised from first portion 22. First portion 22 includes a set of user I/O pins 26 and corresponds to a bottom surface of a circuit board, as discussed below. Additionally, note that the bottom of front surface 12 includes a chamfer 40, as can be seen in FIG. 3. More information about chamfer 40 will be provided below.

In one implementation, the memory card is 12 mm wide and 15 mm long. The angled portion is at a forty five degree angle. The thickness of the memory card is 0.9 mm at second portion 24, 1.0 mm at raised portion 18 and 0.8 mm at first portion 22. In another embodiment, the thickness of the memory card is 0.8 mm at second portion 24, 1.0 mm at raised portion 18 and 0.7 mm at first portion 22. In other embodiments, other dimensions can also be used.

In one embodiment, a label will be placed on the top surface. This label can be a sticker or can be ink which is pad printed.

Figure 4:
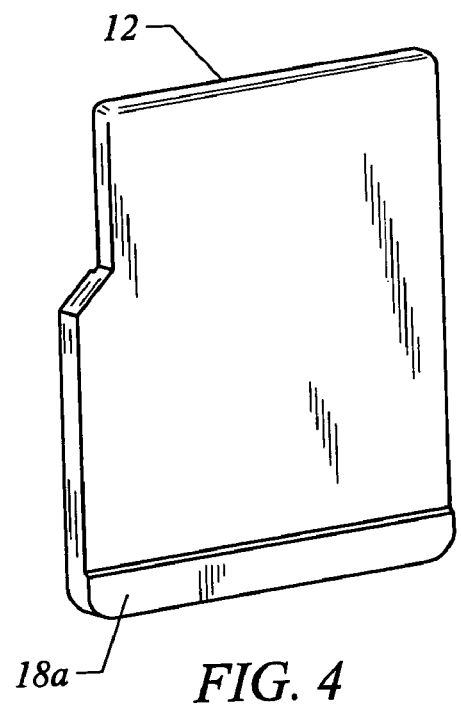
FIG. 4 is a perspective view of the top of a memory card according to a one embodiment of the present invention.
Figure 5:
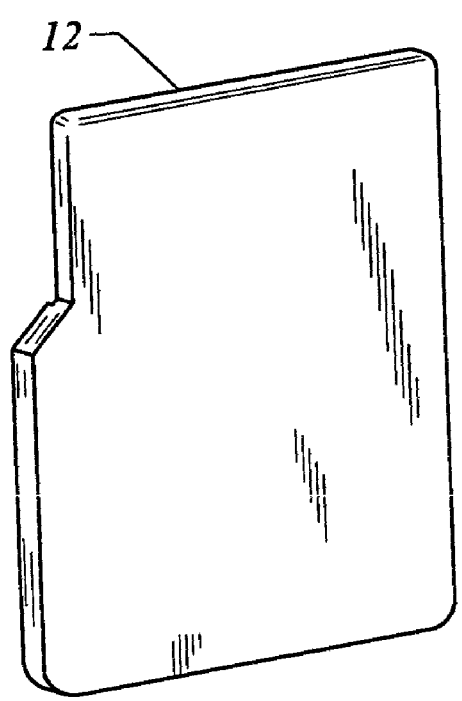
FIG. 5 is a perspective view of the top of a memory card according to a one embodiment of the present invention.

FIG. 4 is a perspective view of the top of a memory card according to a second embodiment of the present invention. The second embodiment includes a raised portion 18a that has a straight profile. FIG. 5 is a perspective view of the top of a memory card according to a third embodiment of the present invention which does not include a raised portion 18.

Figure 6A:
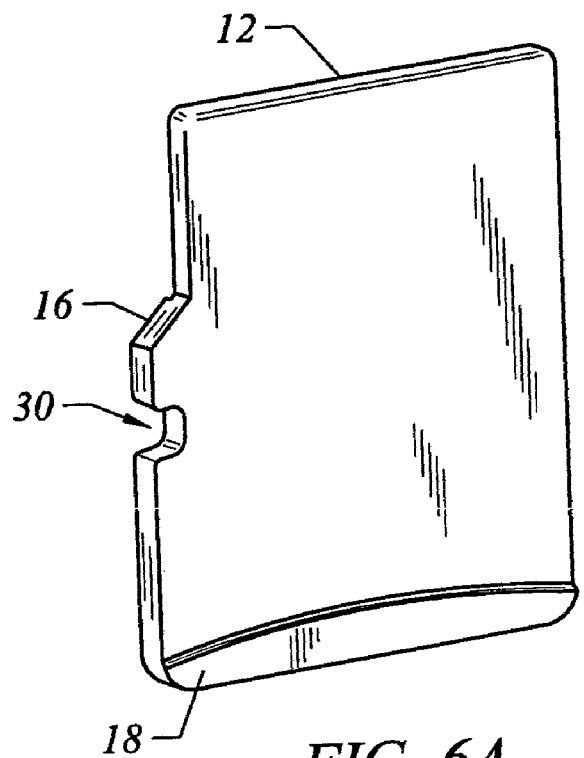
FIG. 6A is a perspective view of the top of a memory card according to a one embodiment of the present invention.
Figure 6B:
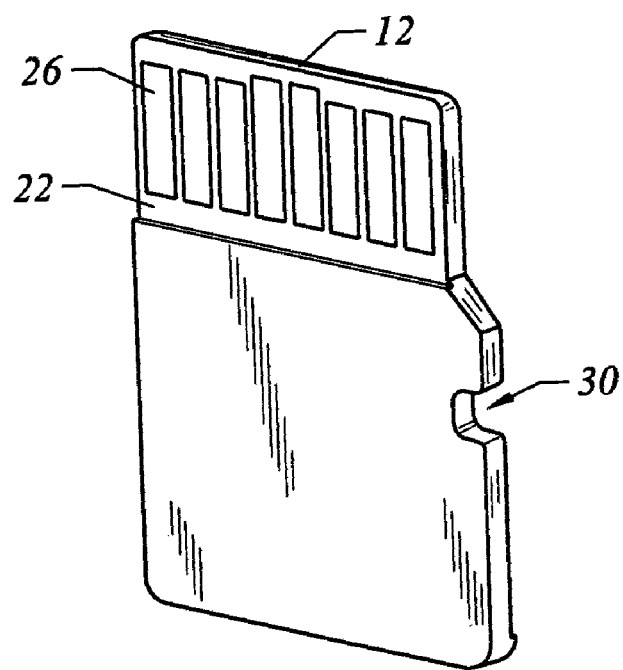
FIG. 6B is a perspective view of the bottom of the memory card according to the one embodiment of the present invention.

FIG. 6A is a perspective view of the top of a memory card according to a fourth embodiment of the present invention. FIG. 6B is a perspective view of the bottom of the memory card according to the fourth embodiment of the present invention. The fourth embodiment includes notch 30. The notch is used to secure the card in position when connected to a host device.

FIG. 7A is a perspective view of the top of a memory card according to a fifth embodiment of the present invention. FIG. 7B is a perspective view of the bottom of the memory card according to the fifth embodiment of the present invention. FIG. 7C is a side view of the memory card according to the fifth embodiment of the present invention. FIG. 7D is an additional side view of the memory card according to the fifth embodiment of the present invention. Note that the fifth embodiment includes the notch 30, raised portion 18 and chamfer 40 (see FIGS. 7C and 7D). The bottom surface of the memory card includes a first portion 22A and a second portion 24A, where second portion 24A is raised from first portion 22A by 0.1-0.2 mm.

FIG. 7D shows other dimensions in millimeters. For example, the length of the memory card is 15 mm, the width at raised portion is 1.0 mm +/−0.1, the width at first portion 22A is 0.7 mm +/−0.1 and the width of chamfer 40 is 0.3 mm +/−0.1.

Figure 8:
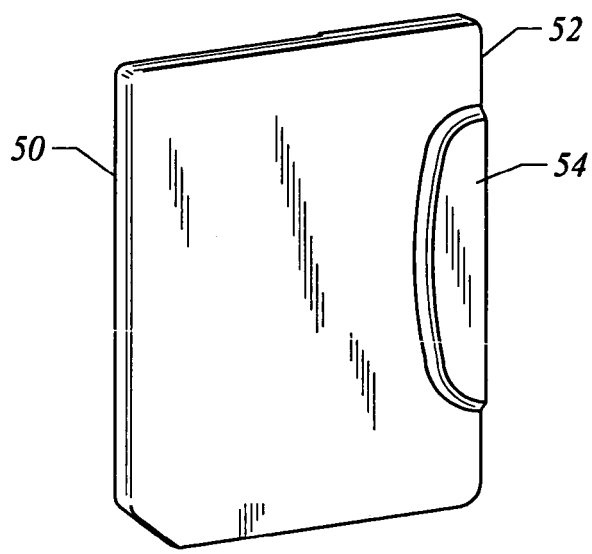
FIG. 8 is a perspective view of the top of a memory card according to a fifth embodiment of the present invention.
Figure 10:
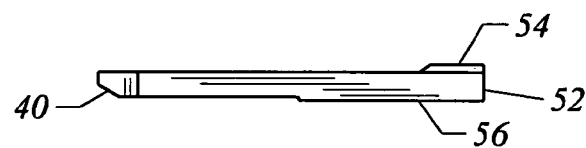
FIG. 10 is a side view of the memory card according to the fifth embodiment of the present invention.
Figure 9:
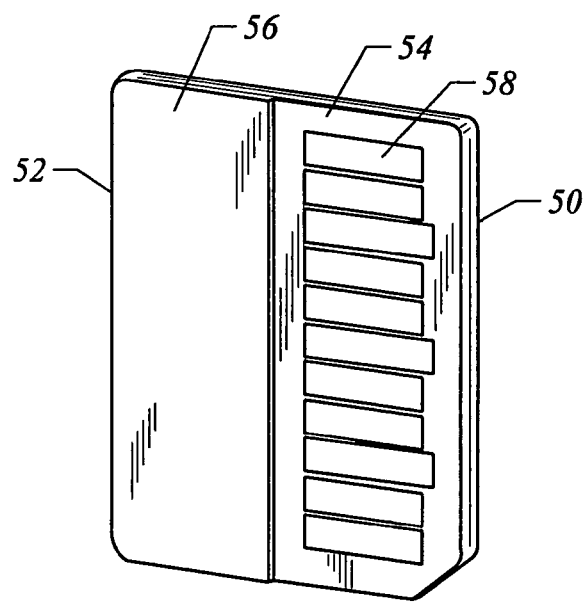
FIG. 9 is a perspective view of the bottom of the memory card according to the fifth embodiment of the present invention.

FIG. 8 is a perspective view of the top of the memory card according to a sixth embodiment of the present invention. FIG. 9 is a perspective view of the bottom of the memory card according to the sixth embodiment of the present invention. FIG. 10 is a side view of the memory card according to the sixth embodiment of the present invention. The sixth embodiment of the present invention implements a different orientation than the other embodiments described above. For example, the top surface of the memory card in the sixth embodiment includes a raised portion 54 adjacent back edge 52, which runs along the length as opposed to the width of the memory card. The memory card of the sixth embodiment includes a front surface 50 that also runs along the length of the memory card. The bottom surface of the memory card includes a first portion 54 and second portion 56. First portion 54 includes a set of user I/O pins 58 and corresponds to a bottom surface of a circuit board, as discussed below. Second portion 56 is raised from first portion 54.

Figure 11:
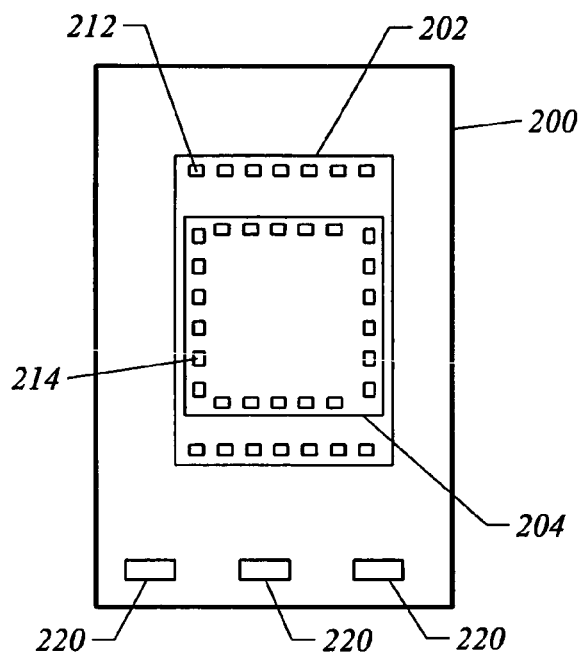
FIG. 11 is a top view of a circuit board used for various embodiments of the present invention.

FIG. 11 provides a top view of a circuit board used for various embodiments of the present invention. FIG. 11 shows circuit board 200. Mounted on circuit board 200 are first die 202 and second die 204. In one embodiment, die 202 includes a flash memory array with associated circuitry and die 204 includes a controller. In some embodiments, the memory card may include more than one memory array. In embodiments that include a peripheral card other than a memory card, the dies can be components other than or in addition to memory arrays and controllers. Note that die 202 includes contacts 212 (e.g. die bond pads) which are used to connect die 202 to other components. Similarly, die 204 includes contacts 214 (e.g. die bond pads) to connect die 204 to other components. Circuit board 200 also includes passive components 220, which could include capacitors and/or resistors. Circuit board 200 includes a number of conductive traces (not shown) which interconnect the devices mounted on the circuit board. Connecting regions (not depicted) are provided on the circuit board so that the leads from dies can be connected to the circuit board by conventional wire bonding. In other embodiments, other means different than wire bonding can be used to connect the dies to the circuit board.

Figure 12:
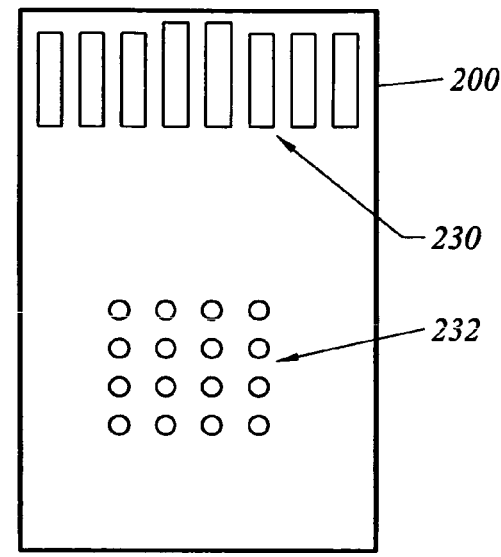
FIG. 12 is a bottom view of the circuit board used for various embodiments of the present invention.

FIG. 12 shows the bottom of circuit board 200. In one embodiment, the bottom of circuit board 200 includes user I/O pins 230 and test pins 232. FIG. 12 depicts eight user I/O pins 230 and sixteen test pins 232; however, different numbers of pins can also be used. The test pins 232 can include data pins and/or power pins. The test pins are used to test one or more of the components of the memory card. For example, the test pins can be used to test each of the cells of the memory array. The user I/O pins 230 are used by a host device connected to the memory card in order to communicate with the memory card. For example, the user I/O pins 230 can be used to communicate with the controller on die 204. Note that in order to have a small package, one embodiment of the present invention includes mounting the integrated circuits on a first surface of the circuit board (e.g. the top surface) and forming the terminals (user I/O pins and test pins) on a conductive layer on another surface of the circuit board (e.g. the bottom surface).

Figure 13:
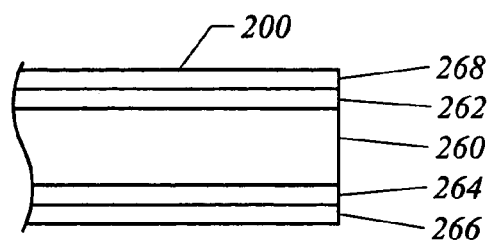
FIG. 13 is a cross section of an exemplar circuit board.

FIG. 13 shows a cross sectional view of circuit board 200. FIG. 13 shows five layers 260, 262, 264, 266, and 268. Other embodiments have less than or more than five layers. Layer 260, the middle layer, is an insulating core layer. Layers 262 and 264 are routing layers, which include conductive metal traces. Layers 266 and 268 include solder masks. Connections between layers (such as layers 262 and 264) can be made by conductive vias. In one embodiment, the circuit board is a printed circuit board. In another embodiment, the circuit board is a lead frame. Other types of circuit boards may also be used within the spirit of the present invention.

Figure 14:
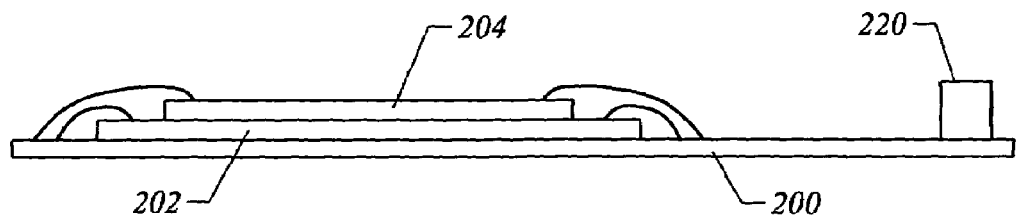
FIG. 14 is a cross sectional view of one embodiment of a circuit board and various components on the circuit board during the manufacturing process.

FIGS. 14-16A graphically depict the manufacturing process for creating the memory card according one embodiment of the present invention. FIG. 14 is a side view of the memory card during the manufacturing process, prior to encapsulation. FIG. 14 depicts circuit board 200. Mounted on circuit board 200 is die 202. Mounted on die 202 is die 204. FIG. 14 shows die 202 and die 204 wire bonded to circuit board 200. FIG. 14 also shows passive devices 220, which can be capacitors and/or resistors. In one embodiment, die 202 is mounted on circuit board 200 using an adhesive material. The adhesive material may be an epoxy adhesive, soft solder or any other adhesive material for mounting a die to a substrate. Die 204 is mounted on die 202 by way of an adhesive material applied to the top surface of die 202 and the bottom surface of die 204. More information about stacking two dies on top of each other can be found in U.S. Pat. No. 5,502,289, incorporated herein by reference in its entirety. In one embodiment, the passive devices are surface mounted using solder.

Figure 15:
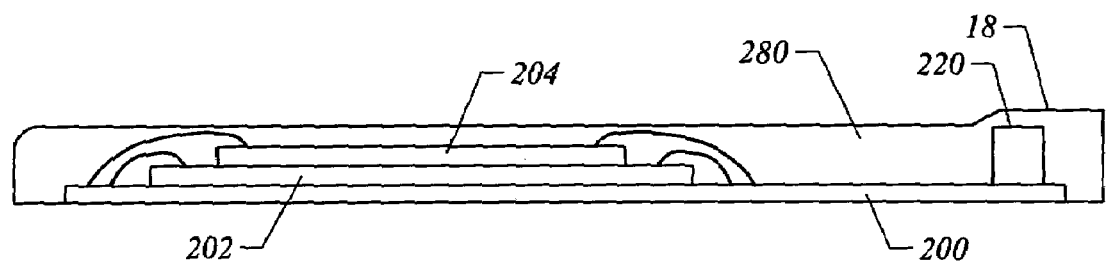
FIG. 15 is a cross sectional view of one embodiment of a circuit board and various components encapsulated on the circuit board during the manufacturing process.

FIG. 15 shows the memory card of FIG. 14 after encapsulation. That is, using an injection mold process or a transfer mold process, molding material 280 is used to encapsulate the components of the memory card. Note that the encapsulation covers the side surfaces, front surface, back surface, and top surface of circuit board 200. The encapsulation also covers all the components mounted on the top surface of circuit board 200. The bottom surface of circuit board 200, which includes user I/O pins 230 and test pins 232, is not covered by the encapsulation. In some embodiment, encapsulation can cover a subset of that described above.

Figure 16:
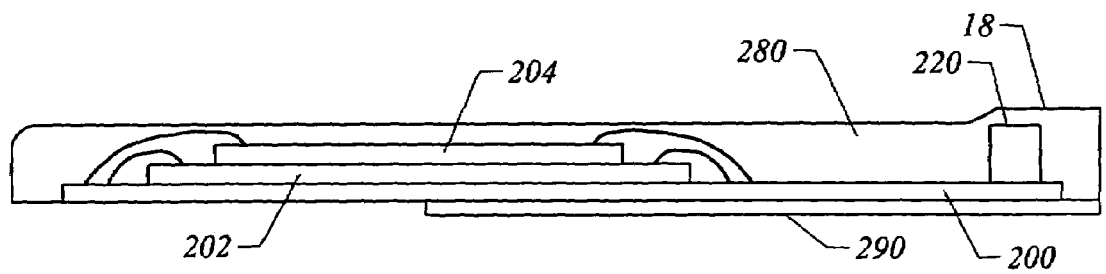
FIG. 16 is a cross sectional view of one embodiment of a circuit board and various components on the circuit board, with a conformal contact coating applied to a surface of the circuit board.

Subsequent to encapsulation, a conformal contact coating 290 is applied to a portion of the bottom surface of circuit board 200 in order to cover test pins 232. The conformal contact coating does not cover user I/O pins 230. FIG. 16 depicts the memory card after the conformal contact coating 290 has been applied. For example, the conformal contact coating 290 is applied to portion 24 (see FIG. 1) of the bottom surface of the memory card, but not to portion 22 of the memory card. The conformal contact coating protects the test pins from electrostatic discharge and protects the data in the memory from unwanted access via the test pins by blocking the test pins. The coating is a conformal contact coating because it conforms to the shape of the surface it is being applied to and it is in direct contact to that surface. Some other memory cards may use a lid to cover the bottom of the circuit board. That lid is not in contact with the bottom surface of the circuit board. Rather, an air gap will exist between the bottom lid and circuit board. Additionally, because the lid is prefabricated it will not conform to the shape of the bottom surface of the bottom of the circuit board.

In one embodiment, the application of the conformal contact coating includes applying a liquid directly to the bottom surface of the circuit board. The coating then dries to a solid. In another embodiment, the coating is applied as a film directly to the bottom surface of the circuit board. Examples of coatings include photoresist, solder mask, epoxy, thermoplastic, and polyimide. One specific example of a suitable coating is the PSR-400 Solder Mask from Taiyo America, Inc., www.taiyo-america.com. Examples of a film include mylar with an adhesive or polyimide with an adhesive. An example of a suitable polyimide is Kapton, by DuPont. One example of how to apply a liquid coating is to use a screen printing process.

Figure 16A:
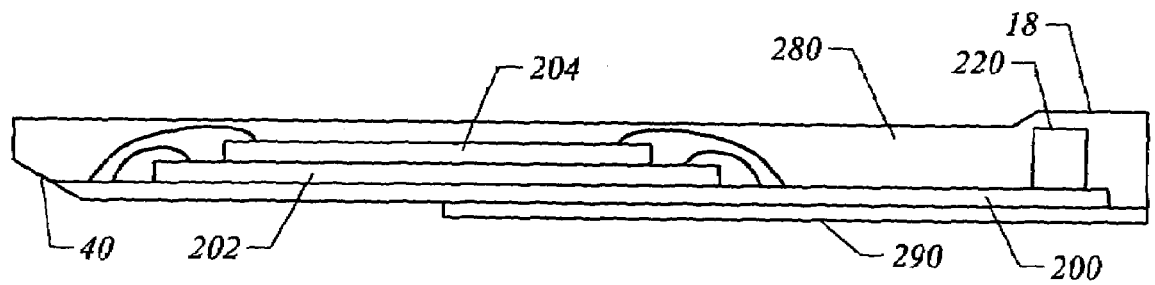
FIG. 16A is a cross sectional view of one embodiment of a circuit board and various components on the circuit board after cutting as chamfer.

FIG. 16A depicts the memory card after chamfer 40 has been cut. In one embodiment, chamfer 40 can be cut after encapsulation with a mechanical cutting process. For example, a diamond saw having a blade with an angle can be used. Other cutting devices can also be used.

Figure 16B:
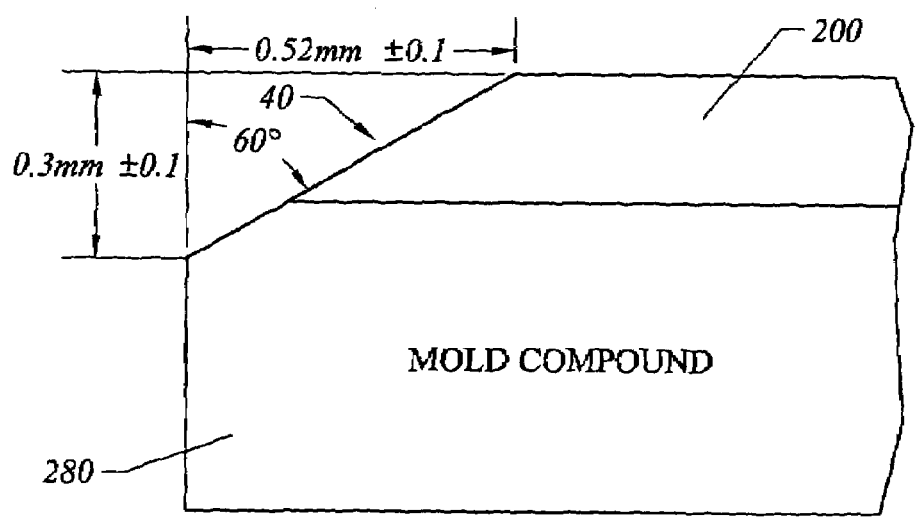
FIG. 16B is a close-up a chamfer cut into a memory card.

FIG. 16B shows a close-up of chamfer 40. In one embodiment, the chamfer is cut through molding material 280 and circuit board 200. In other embodiments, chamfer 40 is only cut through molding material 280, only cut through circuit board 200 or cut through other materials. In one implementation, chamfer 40 is cut at a 60 degree angle relative to the edge of the memory card. In other embodiment, other angles can be cut.

In some embodiments, chamfer is cut through the bottom surface and front edge of the outer surface of the memory card, thereby, removing a corner of the memory card.

Chamfer 40 narrows the front edge of the memory card so that the memory card is easier to insert into a port/slot/connector. Such a feature is useful since the memory card is so small.

Figure 17:
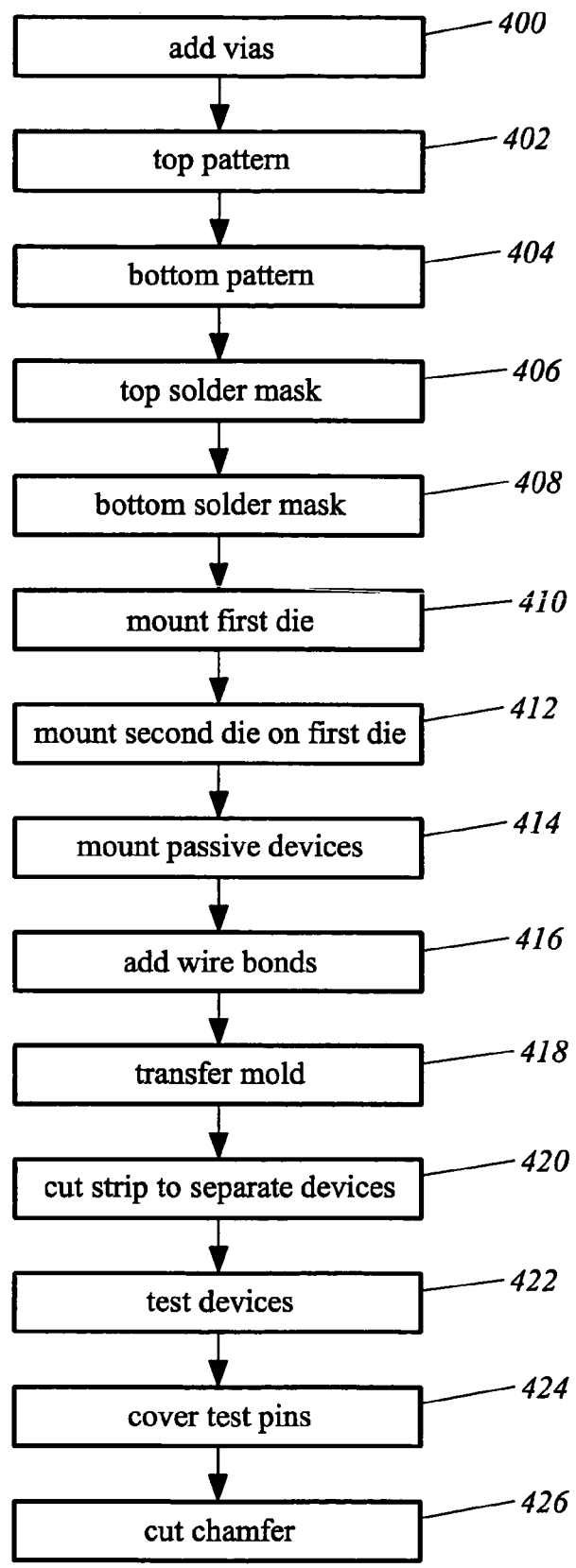
FIG. 17 is a flow chart describing one embodiment of a process for manufacturing a memory card according to the present invention.

FIG. 17 is a flowchart depicting one embodiment of a process for manufacturing a memory card according to the present invention. In step 400, vias are drilled in the circuit board. In step 402, a top pattern is applied to circuit board 200 to add the conductive traces and connection regions discussed above. In step 404, a bottom pattern is applied to the bottom surface of circuit board 200 to add the user I/O pins 230, 232 test pins and conductive traces. In step 406, solder mask is added to the top surface of circuit board 200. In step 408, the solder mask is added to the bottom surface of circuit board 200. In step 410, first die 202 is mounted to circuit board 200. In step 412, second die 204 is mounted to circuit board 200. In step 414, passive devices 220 are mounted to circuit board 200. In step 416, wire bonds are added to connect dies 202 and 204 to circuit board 200. In one embodiment, protective coatings are applied to the wire bonds and/or the dies. In step 418, circuit board 200 and the components mounted on circuit board 200 are subject to a transfer mold process so that the circuit board and its components are encapsulated, as described above. However, the encapsulation process of step 418 does not cover the bottom surface of circuit board 200.

In one embodiment, a memory card is manufactured as a unitary structure. In that case, step 420 is skipped and the process of FIG. 17 proceeds to step 422. However, in other embodiments the memory cards are produced a batch at a time. That is, a strip of memory cards are produced at one time and then a singulation process is performed to cut the strip into individualized memory cards. In the case where the memory cards are produced at a batch at a time, step 420 includes cutting the strip to separate the various memory cards. Step 420 is referred to as singulation.

In step 422, the memory cards are tested. In step 424, the test pins are covered, as described above, by applying the conformal contact coating to a portion of the bottom surface of the circuit board 200 (e.g. bottom portion 24 of FIG. 1). In step 426, chamfer 40 is cut in the memory cards.

Step 422 includes testing the memory cards. During the manufacturing process, the manufacturer may perform a burn-in test of the memory card to verify that each of the memory cells in the memory array are functional. The manufacturer may then program the memory card to avoid bad memory cells. For example, the memory array may include a portion of memory that stores addresses for bad memory cells and pointers to replacement memory cells. In some embodiments, the other components of the memory card may also be tested. Note that FIG. 17 shows that the devices are tested and receive the conformal contact coating after singulation. In another embodiment, step 420 is performed after to step 422; therefore, the various devices are tested and receive the conformal contact coating prior to singulation.

Figure 18:
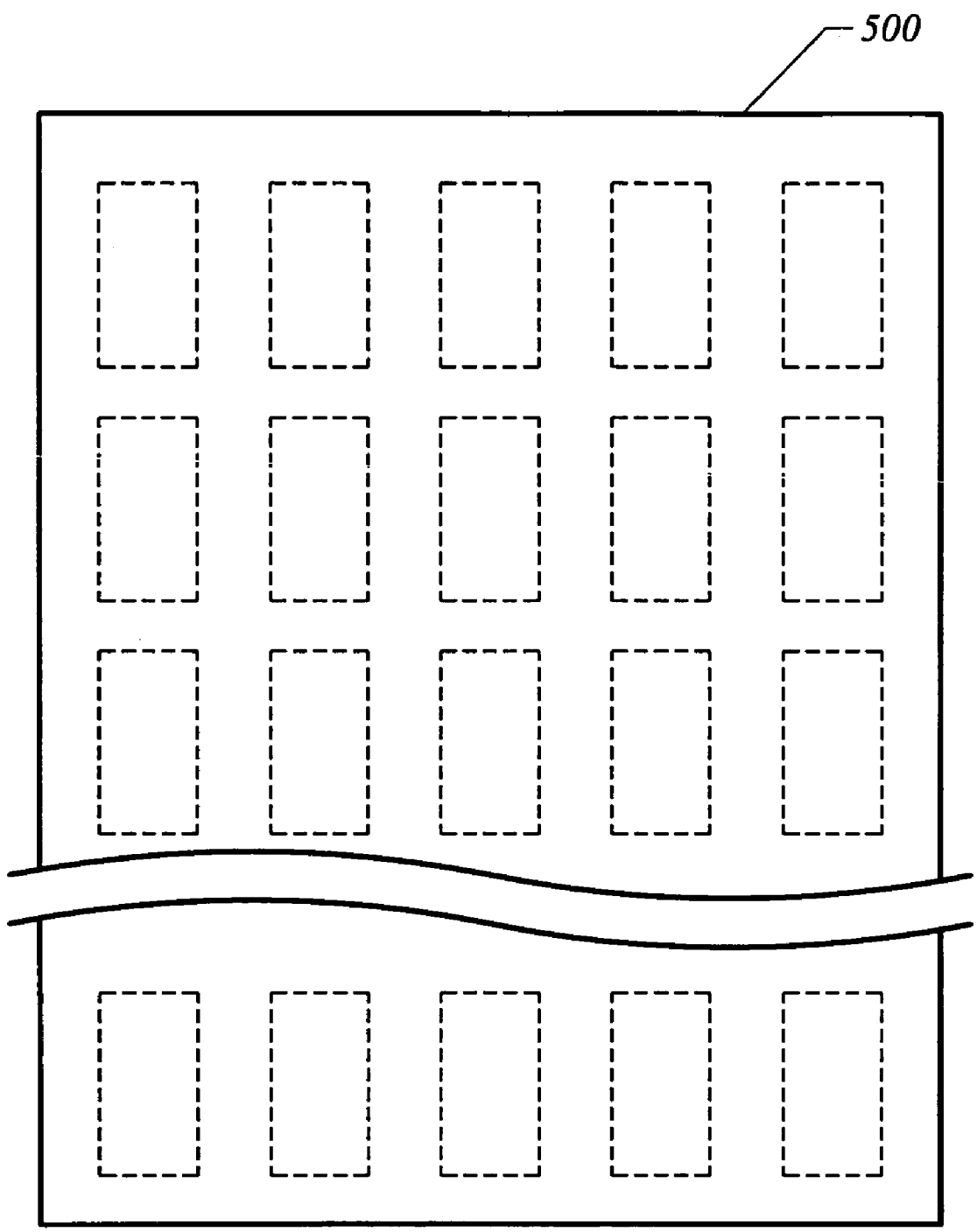
FIG. 18 is a plan view of a strip of memory cards prior to singulation.

FIG. 18 is a plan view of a strip of memory cards prior to singulation. FIG. 18 shows strip 500. On top of strip 500 are various instances of the memory cards. Each memory card is depicted in dashed lines. In one embodiment, strip 500 includes 100 memory cards (5 wide, 20 long). Note that other numbers of memory cards can also be manufactured on a strip. Strip 500 is manufactured by performing steps 400-418 simultaneously for each of the memory cards on the strip. That is, the steps are performed on the strip as a whole. Step 420 is performed by cutting the strip into separate devices. According to one aspect of the present invention, the memory cards are not fully rectangular in their shape. Therefore, the singulation of the strip into individual memory cards includes nonlinear (e.g. curvilinear) sawings. Such sawing can be performed efficiently with a very thin saw with high precision and detail, such that the sawing action is very fine. Examples of the sawing devices include, for example, a water jet cutting device, a laser cutting apparatus, a water guided laser, a dry media cutting device, and a diamond coated wire. Water jet cutting may be the preferred cutting method given its small cutting width (e.g. 50 microns), its ability to shape small features and its rapid cutting rate.

If the memory card fails after it is in use, then the failed memory card can be debugged by removing the conformal contact coating and using the test pins to test the memory card.

FIG. 19 is a perspective view of the top of the memory card according to an additional embodiment of the present invention. FIG. 20 is a perspective view of the bottom of the memory card according to the embodiment of FIG. 19. Card 600 depicted in FIGS. 19 and 20 includes rounded notches 602 and 604, raised portion 606 and angled portion 608. Bottom surface 612 includes pins 620 and portion 622. Portion 622 is raised from surface 612 and covers the test pins as described herein.

FIG. 21 is a perspective view of the top of the memory card according to an additional embodiment of the present invention. FIG. 22 is a perspective view of the bottom of the memory card according to the embodiment of FIG. 21. Card 700 depicted in FIGS. 21 and 22 includes notch 702, raised portion 706 and angled portion 708. Bottom surface 712 includes pins 720 and portion 722. Portion 722 is raised from surface 712 and covers the test pins as described herein.

The description above specifically discusses memory cards. One set of embodiments of the present invention specifically pertain to flash memory cards, which include one or more memory arrays that utilize flash memory technology. The embodiments explained above pertaining to memory cards are for example purposes and are not mean to limit the invention. The technology disclosed herein can also be applied to other peripheral cards that connect to a computing device and are controlled or operated with the computing device. One example of a removable peripheral card is a PCMCIA card. Examples of applications, in addition to memory systems, that can be implemented on peripheral cards include wireless communication devices, GPS devices, cellular devices, network interfaces, modems, disk storage systems, etc. The present invention is not limited to any one type of peripheral card and is meant to be used with many different types of peripheral cards.

Figure 26:
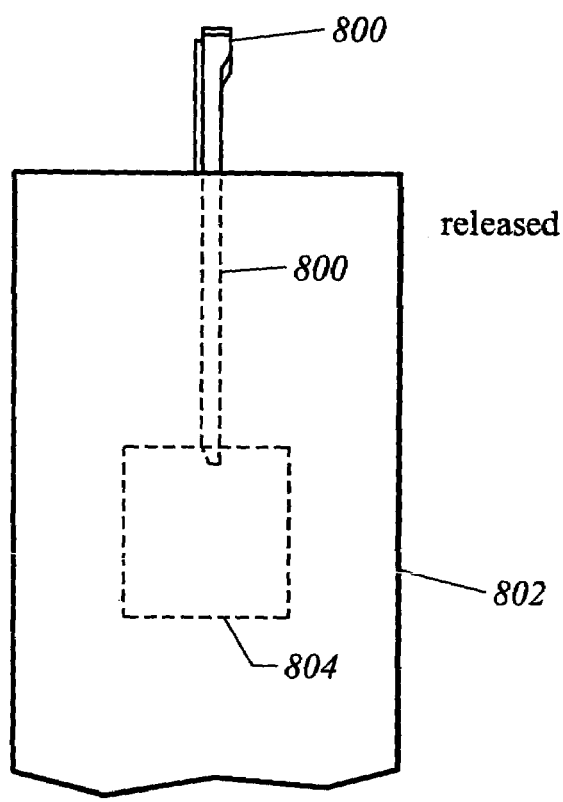

FIG. 26 is a flow chart describing a process for using a memory card (as described above) with a push-push latch of a host device A push-push latch is a latch wherein latching and unlatching is accomplished by an inward push by the user into the latch housing. Push-push latched are known in the art. For example, U.S. Pat. No. 6,719,337 (incorporated herein by reference in its entirety) discloses a push-push latch. Additionally, the Sony Clie PEG-SJ33 handheld computing device from Sony Corporation uses a push-push latch with a Memory Stick.

Figure 23:
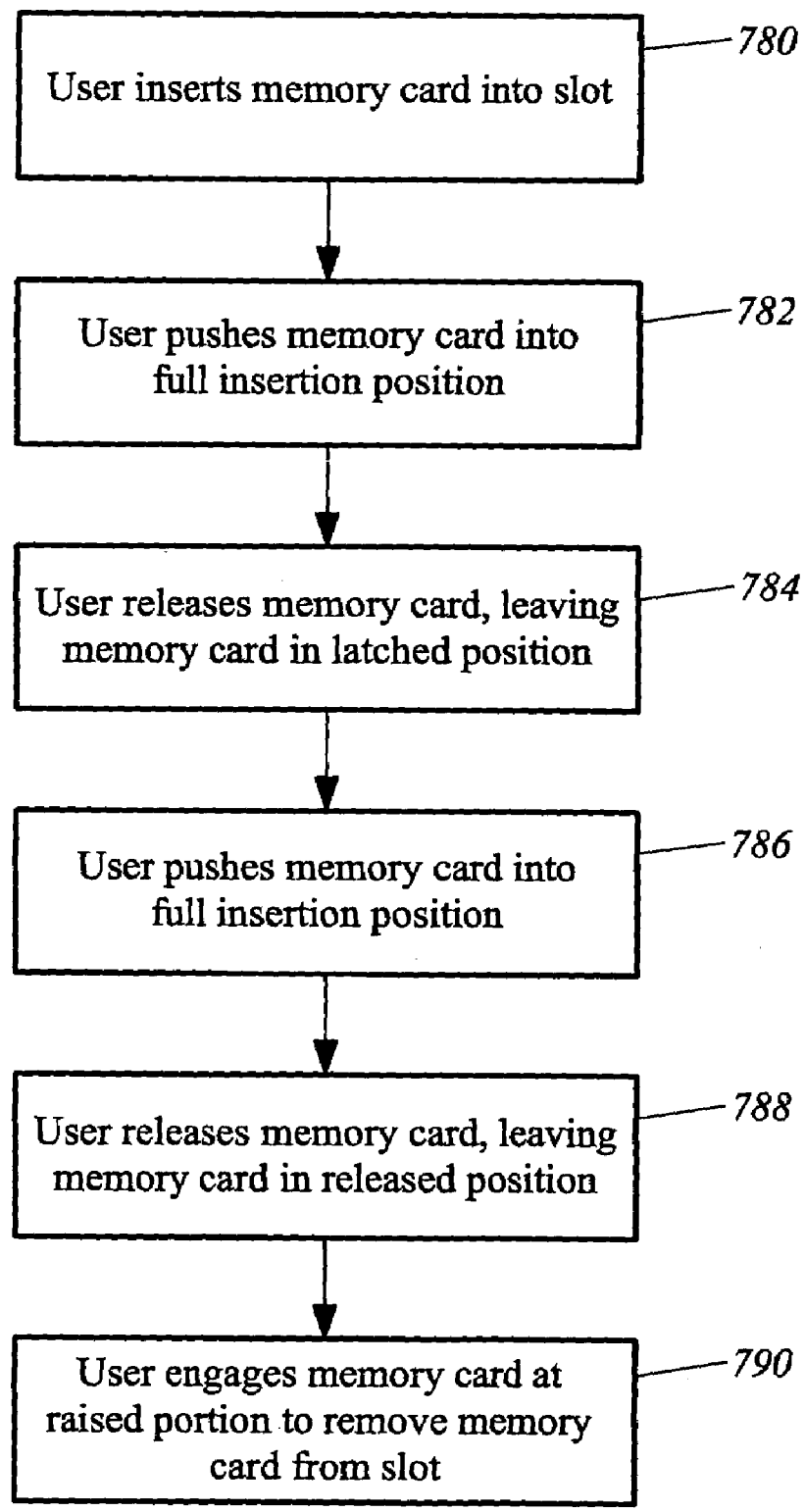
FIG. 23 is a flow chart describing one embodiment of a process for using a memory card with a push-push latch of a host device.
Figure 24:
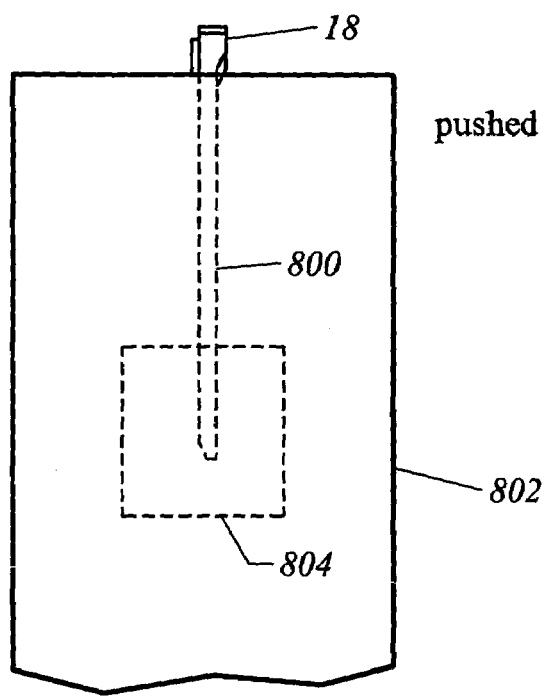
FIGS. 24-27 are block diagrams illustrating a memory card in various engaging positions with a push-push latch of a host device.
Figure 25:
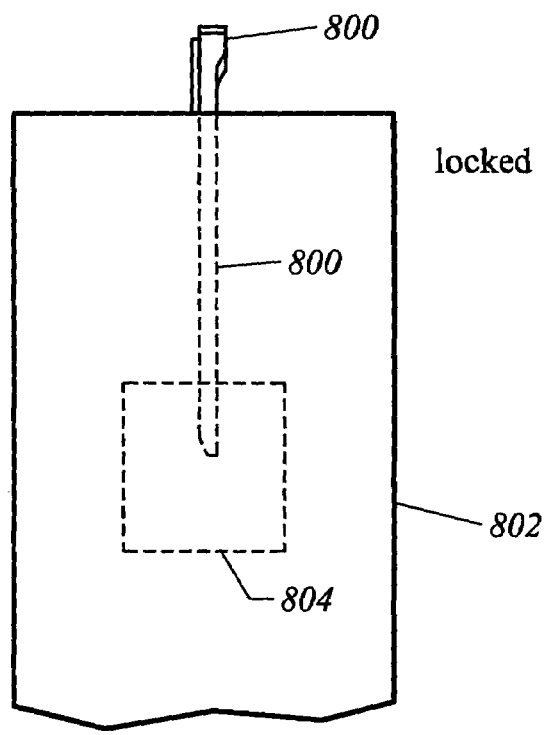

In step 780 of FIG. 23, a memory card (any of the embodiments described above) is inserted into a slot in the host device (e.g. computer, handheld, cellular telephone, game, music device, etc.). In step 782, the user (e.g. a human, a robot, other machine, etc.) pushes the memory card into a full insertion position with respect to the push-push latch. For example, FIG. 24 shows memory card 800 pushed in a full insertion position with respect to the push-push latch 804 of host device 802. In step 784, the user stops pushing the memory card (the user releases the memory card), so that the memory card is moved to its latched position. That is, the memory card is latched to the push-push latch. For example, FIG. 25 shows memory card 800 in a latched position with respect to the push-push latch 804 of host device 802. In the latched position of FIG. 25, memory card is slightly further out of the host then in FIG. 24. That is push-push latch 804 is holding memory card 800. Note that a portion of memory card 800 and push-push latch 804 are shown with dashed lines, indicating that they are inside host device 802. At this point, a user can write data to and read data from memory card 800 using host device 802. In one embodiment, a portion of memory card 800, including raised portion 18, is protruding out from host device 802.

Figure 27:
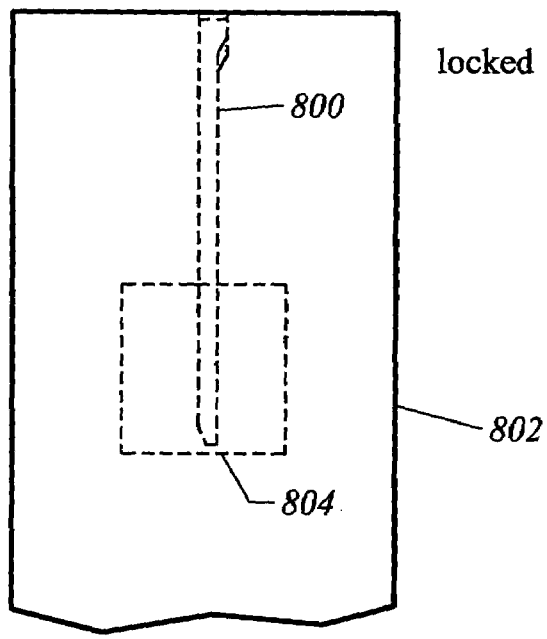

If the user wants to remove memory card 800 from host device 802, the user will push the memory card to its full insertion position in step 786 (see FIG. 24). In step 788, the user stops pushing the memory card, so that the memory card is moved to its released position with respect to the push-push latch 804. For example, FIG. 26 shows memory card 800 in a released position with respect to the push-push latch 804 of host device 802. Note that a portion of memory card 800, including raised portion 18, is protruding out from host device 802. In step 790, the user engages the memory card by the raised portion 18 and pulls the memory card from host device 802. In an alternative embodiment depicted in FIG. 27, memory card 800 is fully inserted into host device 802 when memory card is in the latched position after step 784.

Note that FIGS. 24-27 depict the memory card being inserted into the host device/latch in a vertical orientation. In other embodiment, the memory card can be memory card being inserted into the host device/latch in other orientations, as per the host device.

Because different electronic devices use different types of memory cards, an adaptor is provided that allows the memory cards disclosed herein to be used in ports or connectors on electronic devices that are meant for other types of memory cards (e.g. CompactFlash™, MMC™, Smart Media, Secure Digital™, MiniSD, the Memory Stick, and others). That is, the adapter allows a memory of a first type (e.g. the memory cards described above) to communicate with a system expecting a memory of a second type. In some implementations, the raised portion of the memory card protrudes from the adaptor or can otherwise be accessed by a user when the card is properly inserted in the adaptor so that the user can grab the raised portion and remove the memory card from the adapter.

While in the adaptor, the memory card can be inserted into a host device and data can be written to and read form the memory card. Similarly, the memory card can be inserted into a host device and data can be written to and read form the memory card when the memory card is not in the adaptor.

FIGS. 28A-D show a memory card 902 (could be any of the memory cards described above) and an adapter 900. FIG. 28A depicts the front of adaptor 900. FIG. 28B depicts a perspective view of the front of adaptor 900. The adaptor can be used to allow memory card to work with a host expecting another format (any of the formats listed above, or other formats). Adaptor has a slot 920 for inserting memory card 902. At the entrance of the slot, along the back surface of the adapter, is a circular opening that allows a user to grab the bottom of the memory card. At the entrance of the slot, along the front surface of the adapter, is a rectangular opening that exposes raised portion 18 of memory card 902.

FIG. 28C depicts the back of adapter 900 and memory card 902. FIG. 28C shows pins 910 on adapter 900 and pins 912 on memory card 902. When memory card 902 is inserted into adapter 900, pins 912 of memory card 902 engage connectors inside adapter 900. The connectors inside adapter 900 are attached to wires (or other conductors). The wires connect to the appropriate pins 910 of adapter 900. In some embodiment, adapter 900 may include electronics, including logic, for converting between memory formats. Note that adapters between memory formats are known in t he art. For example, see U.S. Pat. No. 6,381,662, which is incorporated herein by reference in its entirety.

FIGS. 28A and 28B depict the memory 902 about to be (but not) inserted into adapter 900. FIG. 28D shows memory card 902 inserted in adapter 900. When memory card 902 is inserted in adapter 900, raised portion 18 is exposed so that a user can grab raised portion with fingers or tools and pull (or otherwise remove) memory card 902 from adapter 900. In one embodiment, when card 902 is inserted in adapter 900, the top of raised portion 18 is higher than the surface of the adapter so that is protrudes from the adapter.

As described herein, the memory card can be manufactured and used without a bottom lid or a top lid. Such a memory card can then be inserted into the adaptor, where the adaptor includes or serves as a top lid and/or bottom lid. That is the outside shell of the adaptor serves as the top lid and bottom lid (or a shell or an enclosure), so that the memory card has a top lid and bottom lid in a similar manner as other types of memory cards. The memory card is enclosed within the adapter, except for the exposed portion depicted in FIG. 28D. As described above, the memory card can be used (read and write data) while in the adaptor that includes or serves as a top lid and/or bottom lid.

Figure 29:
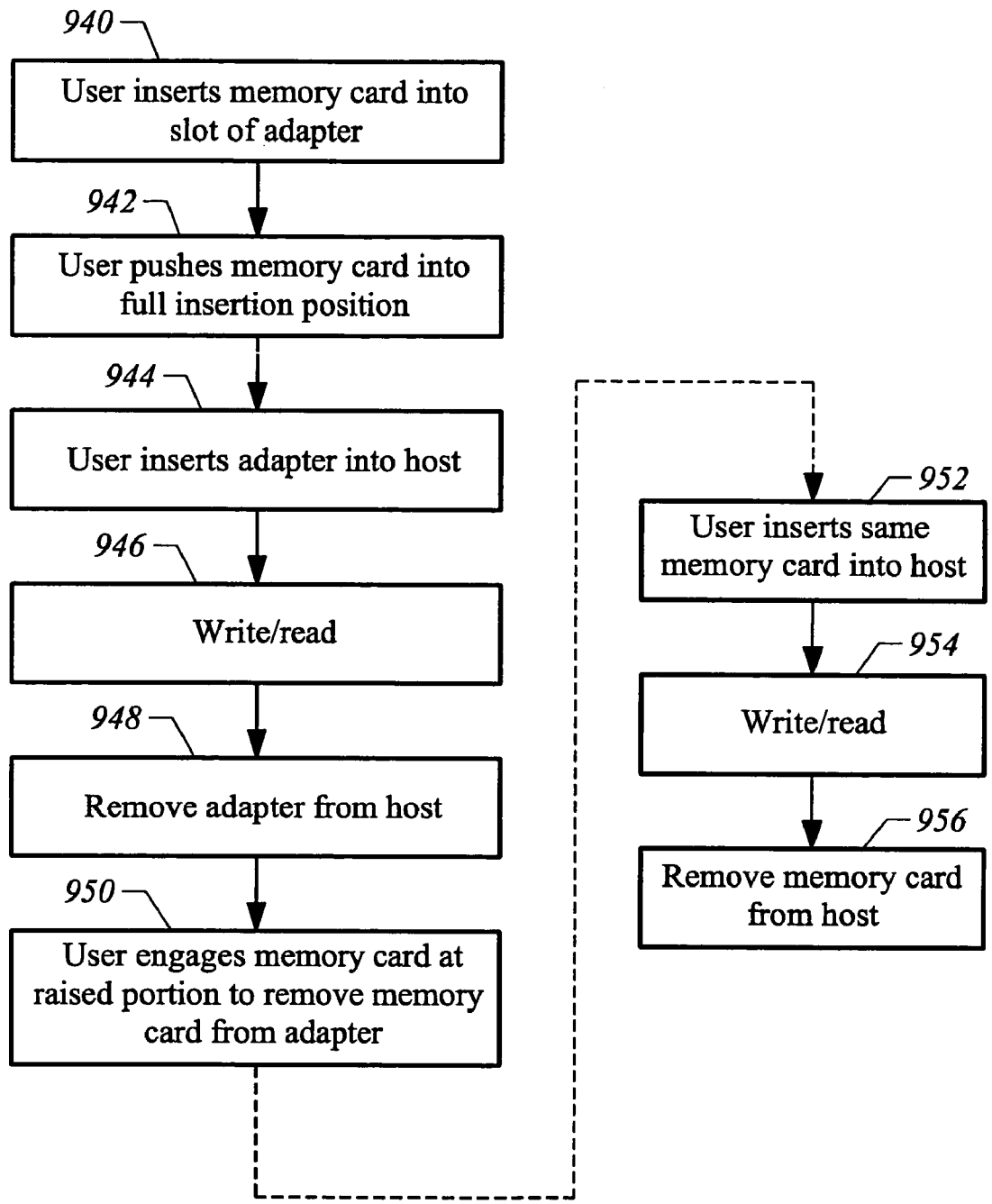
FIG. 29 is a flow chart describing one embodiment of a process for using a memory card with an adapter.

FIG. 29 is a flow chart describing one embodiment of a process for using a memory card with an adapter. In step 940, a user inserts the memory card into a slot in the adapter (e.g. slot 920). In step 942, the user pushed the memory card into a full insertion position so that the pins 912 of memory card 902 engage connectors inside adapter 900. In step 944, the user inserts the adapter (with the memory card) into a host or connects the adapter to a host. In step 946, the user reads from and/or writes to the memory car using the host, via the adapter. In step 948, the user removes (or disconnects) the adapter from the host. In step 950, the user engages the raised portion 18 of the memory card and pulls the memory card out of the adapter.

From box 950 to box 952 is a dashed line, which indicates that steps 952-956 are an optional part of the process of FIG. 29. These steps are performed when a user additionally uses the memory card without the adapter. The flow chart of FIG. 29 teaches that the same memory card can be used with and without the adapter and, therefore, with and without the top and bottom lids/enclosure/shell. In step 952, the user inserts that same memory card into a host (same host or different host). In step 954, the user reads from and/or writes to the memory car using the host. In step 956, the user removes the memory card from the host. Note that step 952 and 956 can be performed using the processes described above with respect to the push-push latch or using various methods known in the art.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A non-volatile memory system, comprising:
    a removable card having a set of contacts on an external surface of said card, said card including: a bottom surface; a top surface opposite the bottom surface, the top surface having a raised portion;
    a bottom edge extending between the top and bottom surfaces; a top edge opposite the bottom edge;
    a pair of side edges extending between the top and bottom surfaces and the top and bottom edges;
    a set of contacts on said bottom surface adjacent the top edge;
    a circuit board in said card;
    a non-volatile storage device enclosed within said card and connected to said circuit board;
    molding compound encapsulating the printed circuit board and plurality of non-volatile storage elements, the molding compound generally defining the top and bottom surfaces, the top and bottom edges and the pair of side edges;
    test pins, exposed through a surface of the molding material, for testing operation of the non-volatile storage device;
    a conformal coating removably covering the test pins;
    passive electrical elements enclosed within said card and connected to said circuit board, said passive electrical elements are positioned in a part of said card at least partially defined by said raised portion;
    a chamfer forming a sloped surface between the bottom surface and the top edge; and
    a host device, said host device includes a push-push connector for engaging and disengaging said removable card.

2. The non-volatile memory system according to claim 1, wherein:
    said non-volatile storage device is a flash memory array.

3. The non-volatile memory system according to claim 1, wherein:
    said top surface defines a length and a width of said card.

4. The non-volatile memory system according to claim 1, wherein:
    said raised portion provides a grip to grab said card from said push-push connector.

5. The non-volatile memory system according to claim 1, wherein:
    said removable card includes molding material encapsulating said non-volatile storage device and said passive electrical elements.

6. The non-volatile memory system according to claim 1, wherein:
said push-push connector holds said removable card in an engaging position after said removable card is pushed into said push-push connector.

7. The non-volatile memory system according to claim 6, wherein:
said raised portion protrudes from said host device when said removable memory card is in said engaging position.

8. A non-volatile memory system, comprising:
a peripheral card, including:
a bottom surface including a first planar portion and a second planar portion residing in a different plane than the first planar portion;
a top surface opposite the bottom surface, the top surface having a raised portion;
a bottom edge extending between the top and bottom surfaces;
a top edge opposite the bottom edge;
a pair of side edges extending between the top and bottom surfaces and the top and bottom edges, one side edge of the pair of said edges including first and second sections extending generally parallel to each other and a third section extending between the first and second sections and forming an oblique angle with each of the first and second sections, one of the first and second sections including a notch;
a set of contacts on said bottom surface, in the first planar portion and adjacent the top edge;
a circuit board in said card
a plurality of non-volatile storage elements enclosed within said card; and
molding compound encapsulating the circuit board and plurality of non-volatile storage elements, the molding compound generally defining the top and bottom surfaces, the top and bottom edges and the pair of side edges;
test pins, exposed through a surface of the molding compound, for testing operation of the non-volatile storage elements;
a conformal coating removably covering the test pins;
a passive electrical element enclosed within said card and positioned in said second portion, and
a push-push connector for engaging and disengaging said peripheral card.

9. The non-volatile memory system according to claim 8, further comprising:
a circuit board, said non-volatile storage device and said passive electrical element are connected to said circuit board.

10. The non-volatile memory system according to claim 8, wherein:
said push-push connector holds said peripheral card in an engaging position after said removable card is pushed into said push-push connector; and
said raised portion protrudes from said host device when said removable memory card is in said engaging position.

11. The non-volatile memory system according to claim 9, further comprising:
a controller, said controller is enclosed within said peripheral card and is connected to said circuit board; and
a set of electrical contacts on an external surface of said peripheral card, said set of electrical contacts are in communication with said controller.

12. A non-volatile memory system, comprising:
a memory card, including:
a bottom surface including a first planar portion and a second planar portion residing in a different plane than the first planar portion, the card being thinner at the first planar portion than at the second planar portion;
a top surface opposite the bottom surface, the top surface having a raised portion;
a bottom edge extending between the top and bottom surfaces;
a top edge opposite the bottom edge;
a pair of side edges extending between the top and bottom surfaces and the top and bottom edges, one side edge of the pair of said edges including first and second sections extending generally parallel to each other and a third section extending between the first and second sections and forming an oblique angle with each of the first and second sections, one of the first and second sections including a notch;
a circuit board;
a memory device connected to said circuit board;
molding material covering said memory device and at least a portion on said circuit board, said molding material having an exterior surface with a chamfer on said exterior surface;
test pins, exposed through a surface of the molding compound, for testing operation of the non-volatile storage elements;
a conformal coating removably covering the test pins; and
a passive electrical element enclosed within said card and connected to said circuit board, said passive electrical elements is positioned in a part of said card at least partially defined by said raised portion; and
a push-push connector for engaging and disengaging said memory card.

13. The non-volatile memory system according to claim 12, further comprising:
a controller, said controller is enclosed within said peripheral card and is connected to said circuit board; and
a set of electrical contacts on an external surface of said peripheral card, said set of electrical contacts are in communication with said controller.

14. The non-volatile memory system according to claim 12 wherein:
said push-push connector holds said peripheral card in an engaging position after said removable card is pushed into said push-push connector; and
said raised portion protrudes from said host device when said removable memory card is in said engaging position.

15. The non-volatile memory system according to claim 12, wherein:
said raised portion provides a grip to grab said card from said push-push connector.

16. The non-volatile memory system according to claim 12, wherein:
said push-push connector holds said removable card in an engaging position after said removable card is pushed into said push-push connector.

17. A memory card according to claim 12, wherein:
said external surface having a rear external region, said raised portion is on said rear external region; and
said external surface having a front external region, said chamfer is on said front external region.

* * * * *